United States Patent
Jang et al.

(10) Patent No.: US 8,916,003 B2
(45) Date of Patent: Dec. 23, 2014

(54) WAFER SCRUBBER

(75) Inventors: Jeng-Hsing Jang, Taoyuan County (TW); Yi-Nan Chen, Taoyuan County (TW); Hsien-Wen Liu, Taoyuan County (TW)

(73) Assignee: Nanya Technology Corporation, Taoyuan (TW)

(*) Notice: Subject to any disclaimer, the term of this patent is extended or adjusted under 35 U.S.C. 154(b) by 250 days.

(21) Appl. No.: 13/243,315

(22) Filed: Sep. 23, 2011

(65) Prior Publication Data

US 2013/0074878 A1   Mar. 28, 2013

(51) Int. Cl.
*B08B 3/04* (2006.01)
*B08B 17/02* (2006.01)
*H01L 21/67* (2006.01)

(52) U.S. Cl.
CPC ........ *B08B 17/025* (2013.01); *H01L 21/67051* (2013.01); *H01L 21/6715* (2013.01); *Y10S 134/902* (2013.01)

USPC .......... 134/33; 134/104.2; 134/157; 134/902

(58) Field of Classification Search
USPC ...................... 134/33, 34, 157, 902
See application file for complete search history.

(56) References Cited

U.S. PATENT DOCUMENTS

| | | | |
|---|---|---|---|
| 3,244,360 A * | 4/1966 | Green | 494/36 |
| 4,517,752 A * | 5/1985 | Devico et al. | 34/58 |
| 7,644,512 B1 * | 1/2010 | Liu et al. | 34/413 |
| 2002/0185155 A1* | 12/2002 | Franklin | 134/1.3 |
| 2006/0102069 A1* | 5/2006 | Tokuri et al. | 118/52 |
| 2010/0144158 A1* | 6/2010 | Ito et al. | 438/758 |

* cited by examiner

*Primary Examiner* — Michael Kornakov
*Assistant Examiner* — Natasha Campbell

(57) ABSTRACT

A wafer scrubber is disclosed, including a chamber, and a holder connecting to a spindle disposed in the chamber, wherein the holder supports a wafer, and the wafer spins to remove water on the wafer, and a meshed inner cup comprising a plurality of through holes disposed between the holder and a wall of the chamber, wherein the meshed inner cup receives water from a surface of the wafer and rotates around the spindle to release the water through the through holes.

15 Claims, 3 Drawing Sheets

WAFER SCRUBBER

BACKGROUND OF THE INVENTION

1. Field of the Invention

This invention generally relates to a wafer scrubber and more particularly to a wafer scrubber system using a high speed spinning action to remove water from a surface of a wafer.

2. Description of the Related Art

Production of semiconductor devices having microscopic structures require high-precision technology. During processing, minute particles of dust on the circuits which constitute a semiconductor device may degrade the reliability of a finished semiconductor device. Even if dust contaminants produced during processing, which end up on a semiconductor wafer, do not adversely affect the circuit functions of the semiconductor device, they still may lead to fabrication difficulties. Therefore, a semiconductor device must be fabricated in a dirt-free environment, and the surface of the semiconductor wafer must be washed to remove minute particles of dust generated during processing.

Referring to FIG. 1, a conventional wafer scrubber comprises a spindle 108 connected to a holder 102 for holding a wafer 106. The wafer 106 is moistened by deionized water 110 (DI water) in a preceding stage. The wafer 106 and the holder 102 spin with a high speed to remove water 110 from the wafer 106 surface. However, this method and scrubber make the water 110 leave the wafer 106 with a high speed, and the high speed water 110 scatters back to impact the wafer 106 when it hits the chamber wall 104. Therefore, particle and chip damage issues are generated.

BRIEF SUMMARY OF INVENTION

The invention provides a wafer scrubber, comprising a chamber, and holder connecting to a spindle disposed in the chamber, wherein the holder supports a wafer, and the wafer spins to release water on the wafer, and a meshed inner cup comprising a plurality of through holes disposed between the holder and a wall of the chamber, wherein the meshed inner cup receives water from a surface of the wafer and rotates around the spindle to release the water through the through holes.

A wafer cleaning procedure, comprising providing a wafer scrubber comprising a chamber, and holder connecting to a spindle disposed in the chamber, wherein the holder supports a wafer and a meshed inner cup comprising a plurality of through holes disposed between the holder and a wall of the chamber, and spinning the wafer to remove water thereon, wherein the meshed inner cup receives water from a surface of the wafer and rotates around the spindle to release the water through the through holes for preventing the water from scattering back to the edge of the wafer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
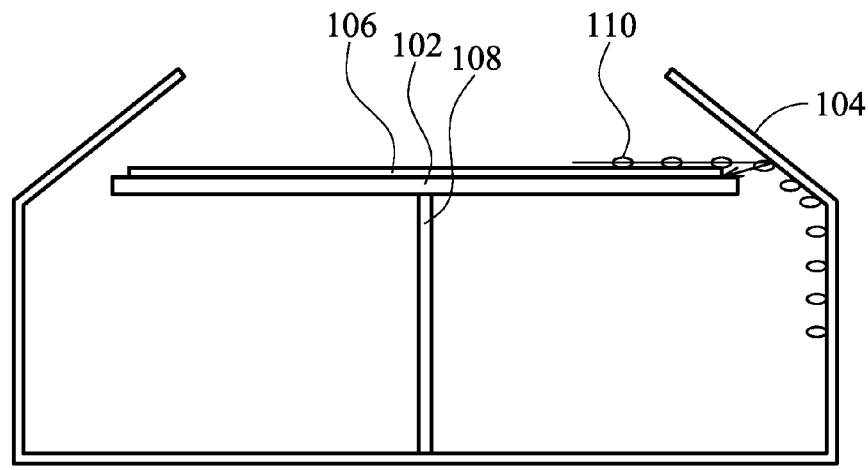
FIG. 1 shows a conventional wafer scrubber.
Figure 2:
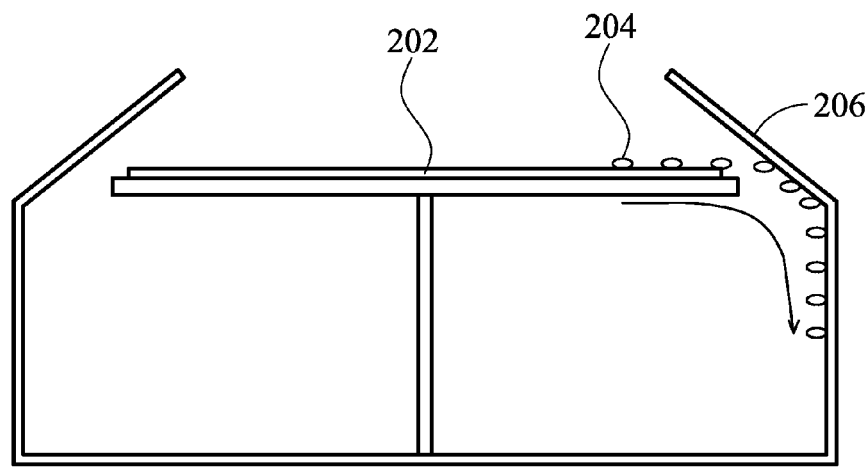
FIG. 2 shows a method to reduce the wafer scattering back issue.

FIG. 2 shows a method to reduce the wafer 202 scattering back issue. Referring to FIG. 2, it is found that a hydrophilic inner surface of an inner cup can reduce the water scattering back issue. Therefore, a method changes material of the inner wall 206 to have a hydrophilic surface for preventing water 204 scattering back to hit the wafer 202 which generates particle and/or chip damage issues. However, this method cannot completely eliminate the water scattering back issue.

Accordingly, a new scrubber and method are required to address the water scattering back issues.

Figure 3A:
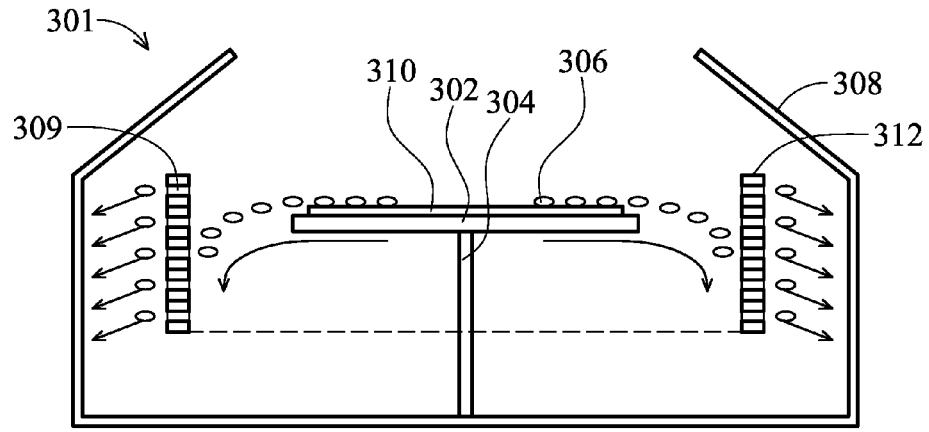
FIG. 3A shows a cross section view of a wafer scrubber of an embodiment of the invention.
Figure 3B:
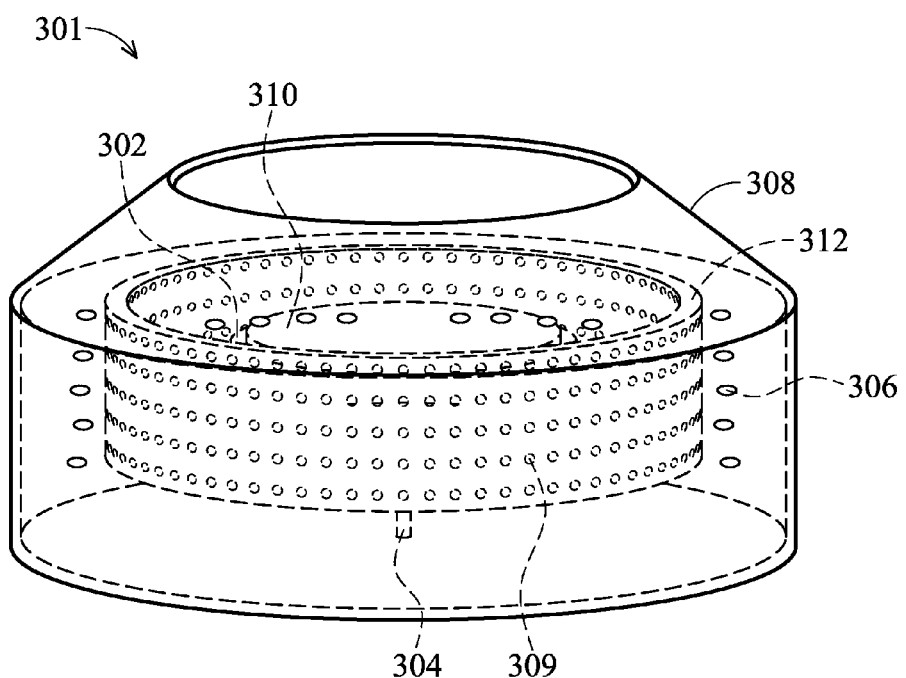
FIG. 3B shows a three dimensional view of a wafer scrubber of an embodiment of the invention.

FIG. 3A shows a cross section view of a wafer scrubber of an embodiment of the invention. FIG. 3B shows a three dimensional view of a wafer scrubber of an embodiment of the invention. Referring to FIGS. 3A and 3B, a wafer holder 302 is connected to a spindle 304 in a chamber. A wafer 310 is disposed on the wafer holder 302 in a chamber 301. The wafer 310 may be moistened by deionized water 306 (DI water) in a preceding stage. The wafer holder 302 and the wafer 310 spin with a high speed to remove water 306 from the wafer 310 surface. In an embodiment of the invention, rotation speed of the wafer 310 can be 1500 rpm~4500 rpm. Moreover, the wafer 310 is separated from the wall 308 of the chamber 301 by a distance of about 30 mm~150 mm. In an embodiment of the invention, the holder 302 holds the wafer 310 by an electric force or clamping.

In an important aspect of the embodiment, a meshed inner cup 312 comprising a plurality of through holes 309 is provided between the wafer holder 302 and the chamber wall 308 in the chamber 301 of the wafer scrubber. In the invention, the through holes in the meshed inner cup 312 are column-shaped. In an embodiment of the invention, the meshed inner cup 312 is formed of hydrophobic material, so that the meshed inner cup 312 can catches more water 306 released from the wafer 310 surface. Alternatively, the meshed inner cup 312 is formed of hydrophilic material, so that the meshed inner cup 312 can release water 306 sooner. The meshed inner cup 312 can spin around the spindle. Rotation speed of the meshed inner cup 312 can be less than, the same as or greater than the rotation speed of the wafer 310 depending upon process conditions, such as water quantity. Further, rotation speed of the meshed inner cup 312 can vary when the quantity of the water 306 from the wafer 310 changes. The spinning meshed inner cup 312 can catch water 306 and release the water 306 via the through holes 309 in the mashed meshed inner cup 312 to the chamber wall 308. Therefore, the meshed inner cup 312 can catch and release water 306, and the water 306 scattering back issue can be addressed.

Figure 4A:
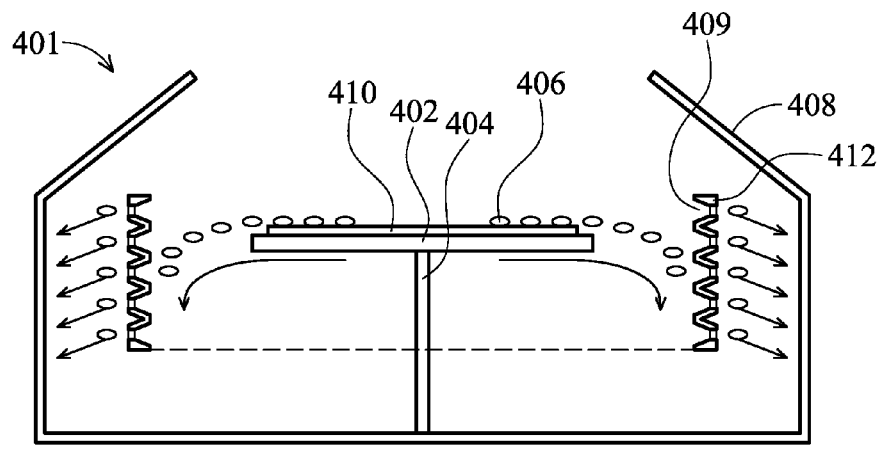
FIG. 4A shows a cross section view of a wafer scrubber of another embodiment of the invention.
Figure 4B:
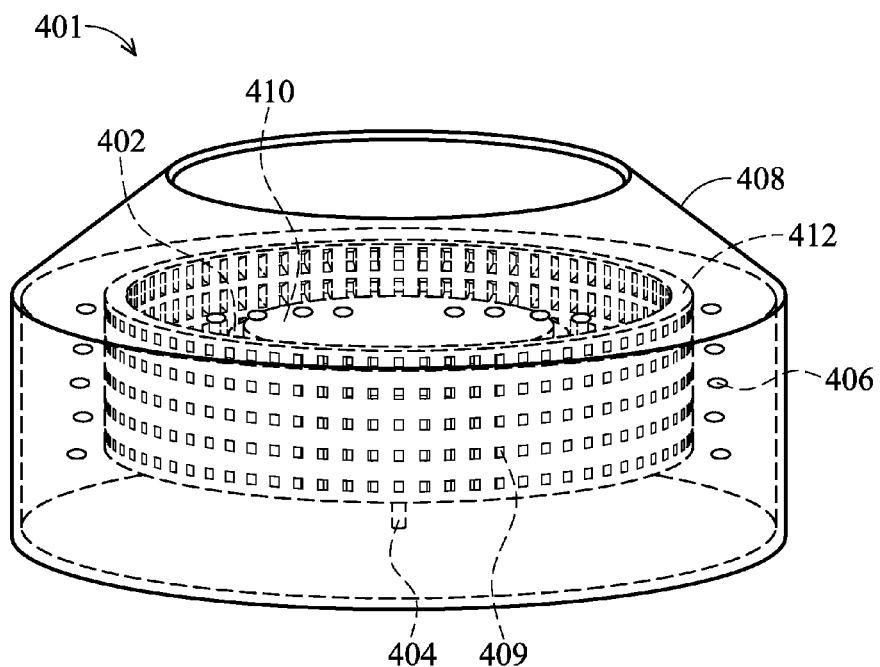
FIG. 4B shows a three dimensional view of a wafer scrubber of another embodiment of the invention.

FIG. 4A shows a cross section view of a wafer scrubber of another embodiment of the invention. FIG. 4B shows a three dimensional view of a wafer scrubber of another embodiment of the invention. Difference between the embodiment in FIG. 3A and FIG. 4A is the shape of the through holes of the meshed inner cup. Referring to FIGS. 4A and 4B, a holder 402 is connected to a spindle in a chamber 401. A wafer 410 is disposed on the holder 402. The wafer 410 may be moistened by deionized water 406 (DI water) in a preceding stage. The wafer holder 402 and the wafer 410 spin with a high speed to remove water 406 from the wafer 410 surface. In an embodiment of the invention, rotation speed of the wafer 410 can be 1500 rpm~4500 rpm. Moreover, the wafer 410 is separated from the chamber wall 408 by a distance of about 30 mm~150 mm. In an embodiment of the invention, the holder 402 holds the wafer 410 by an electric force or clamping using a clamper. In a further embodiment of the invention, the chamber wall 408 is formed of hydrophilic materials.

In an important aspect of the embodiment, a meshed inner cup 412 comprising a plurality of through holes 409 is provided between the wafer holder 402 and the chamber wall 408 in the chamber 401 of the scrubber. In the invention, the through holes 409 in the meshed inner cup 412 are cone-shaped. In more detail, an inner opening of each through hole 409 of the meshed inner cup 412 is larger than the outer opening. In an embodiment of the invention, the meshed inner cup 412 is formed of hydrophobic material, so that the meshed inner cup 412 can catches more water 406 released from the wafer 410 surface. Alternatively, the meshed inner cup 412 is formed of hydrophilic material, so that the meshed inner cup 412 can release water 406 sooner. The meshed inner cup 412 can spin around the spindle 404. Rotation speed of the meshed inner cup 412 can be less than, the same as or greater than the rotation speed of the wafer 410 depending upon process conditions, such as water 406 quantity. Further, rotation speed of the meshed inner cup 412 can vary when the quantity or speed of the water 406 from the wafer 410 changes. The spinning meshed inner cup 412 can catch water 406 and release the water 406 via the through holes 409 in the meshed inner cup 412 to the chamber wall 408. Therefore, the meshed inner cup 412 can catch and release water 406, and the water 406 scattering back issue can be addressed.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer scrubber, comprising:
    a chamber;
    a holder connecting to a spindle disposed in the chamber, wherein the holder supports a wafer; and
    a meshed inner cup comprising a plurality of through holes disposed between the holder and a wall of the chamber, wherein the meshed inner cup receives water from a surface of the wafer and rotates around the spindle to release the water through the through holes, wherein an inner opening of each through hole of the meshed inner cup is larger than an outer opening.

2. The wafer scrubber as claimed in claim 1, wherein the through holes of the meshed inner cup are cone shaped.

3. The wafer scrubber as claimed in claim 1, wherein the meshed inner cup is formed of hydrophobic material.

4. The wafer scrubber as claimed in claim 1, wherein the meshed inner cup is formed of hydrophilic material.

5. The wafer scrubber as claimed in claim 1, wherein the rotation speed of the meshed inner cup is less than, the same as or greater than the rotation speed of the wafer.

6. The wafer scrubber as claimed in claim 1, wherein the rotation speed of the meshed inner cup varies when the quantity of the water from the wafer changes.

7. The wafer scrubber as claimed in claim 1, wherein the holder holds the wafer by an electric force or clamping.

8. The wafer scrubber as claimed in claim 1, wherein the water is deionized (DI) water.

9. A wafer cleaning procedure, comprising:
    providing a wafer scrubber, comprising a chamber, and holder connecting to a spindle disposed in the chamber, wherein the holder supports a wafer and a meshed inner cup comprising a plurality of through holes disposed between the holder and a wall of the chamber, wherein an inner opening of each through hole of the meshed inner cup is larger than an outer opening; and
    spinning the wafer to remove water thereon, wherein the meshed inner cup receives water from a surface of the wafer and rotates around the spindle to release the water through the through holes for preventing the water from scattering back to the edge of the wafer.

10. The wafer cleaning procedure as claimed in claim 9, wherein the rotation speed of the meshed inner cup is less than, the same as or greater than the rotation speed of the wafer.

11. The wafer cleaning procedure as claimed in claim 9, wherein the through holes of the meshed inner cup are cone shaped.

12. The wafer cleaning procedure as claimed in claim 9, wherein the meshed inner cup is formed of hydrophobic material.

13. The wafer cleaning procedure as claimed in claim 9, wherein the meshed inner cup is formed of hydrophilic material.

14. The wafer cleaning procedure as claimed in claim 9, wherein the holder holds the wafer by an electric force or clamping.

15. The wafer cleaning procedure as claimed in claim 9, wherein the water is deionized (DI) water.

* * * * *